(12) United States Patent
McGARVEY et al.

(10) Patent No.: US 11,275,186 B2
(45) Date of Patent: Mar. 15, 2022

(54) IMAGING DEVICES WITH CAPACITIVELY COUPLED SINGLE-PHOTON AVALANCHE DIODES

(71) Applicant: SEMICONDUCTOR COMPONENTS INDUSTRIES, LLC, Phoenix, AZ (US)

(72) Inventors: Brian Patrick McGARVEY, Templemartin (IE); Dariusz Piotr Palubiak, Cork (IE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 70 days.

(21) Appl. No.: 16/668,245

(22) Filed: Oct. 30, 2019

(65) Prior Publication Data

US 2021/0063588 A1 Mar. 4, 2021

Related U.S. Application Data

(60) Provisional application No. 62/891,804, filed on Aug. 26, 2019.

(51) Int. Cl.
*H01L 27/146* (2006.01)
*H01L 31/107* (2006.01)
*G01T 1/24* (2006.01)
*H01L 31/02* (2006.01)

(52) U.S. Cl.
CPC ........ *G01T 1/248* (2013.01); *H01L 27/14609* (2013.01); *H01L 31/02027* (2013.01); *H01L 31/107* (2013.01)

(58) Field of Classification Search
CPC ............... G01T 1/248; H01L 27/14609; H01L 31/02027; H01L 31/107
See application file for complete search history.

(56) References Cited

U.S. PATENT DOCUMENTS

| 8,884,240 B1* | 11/2014 | Shah | G01T 1/1603 |
|---|---|---|---|
| | | | 250/370.14 |
| 9,029,772 B2 | 5/2015 | Pavlov | |
| 10,451,748 B1* | 10/2019 | Qiang | G01T 1/1644 |
| 2013/0313414 A1* | 11/2013 | Pavlov | H01L 31/0224 |
| | | | 250/214.1 |

(Continued)

*Primary Examiner* — Thanh Luu
*Assistant Examiner* — Monica T Taba
(74) *Attorney, Agent, or Firm* — Treyz Law Group, P.C.; Joseph F. Guihan (57) ABSTRACT

An imaging device may include single-photon avalanche diodes (SPADs). Positioning SPADs close together in an imaging device (such as a silicon photomultiplier) may have benefits such as improved sensitivity. However, as the SPADs get closer together, the SPADS may become susceptible to crosstalk. Crosstalk is typically undesirable due to reduced dynamic range and reduced signal accuracy. To reduce crosstalk, a capacitor or other component may be coupled between adjacent SPADs. When an avalanche occurs on a given SPAD, the bias voltage may drop below the breakdown voltage. The capacitor may cause a corresponding voltage drop on a neighboring SPAD. The voltage drop on the neighboring SPAD reduces the over-bias of that SPAD, reducing the sensitivity of the SPAD and therefore mitigating the chance of crosstalk occurring.

6 Claims, 11 Drawing Sheets

(56) References Cited

U.S. PATENT DOCUMENTS

2014/0312448 A1\* 10/2014 Harmon .............. H01L 31/0352
  257/438
2016/0329369 A1\* 11/2016 Harmon .............. H01L 27/1446
2019/0181177 A1\* 6/2019 Kobayashi ........ H01L 27/14636

\* cited by examiner

IMAGING DEVICES WITH CAPACITIVELY COUPLED SINGLE-PHOTON AVALANCHE DIODES

CROSS-REFERENCE TO RELATED APPLICATIONS

This application claims the benefit of U.S. Provisional Patent Application No. 62/891,804, filed on Aug. 26, 2019, the entire contents of which is incorporated herein by reference.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection. However, single-photon avalanche diodes may be susceptible to optical crosstalk.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
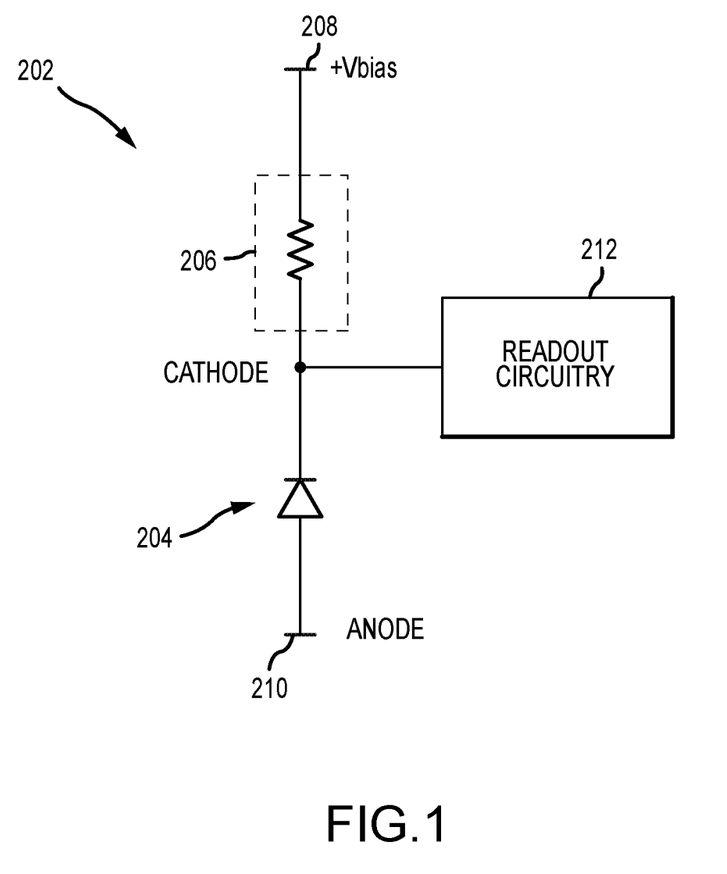
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
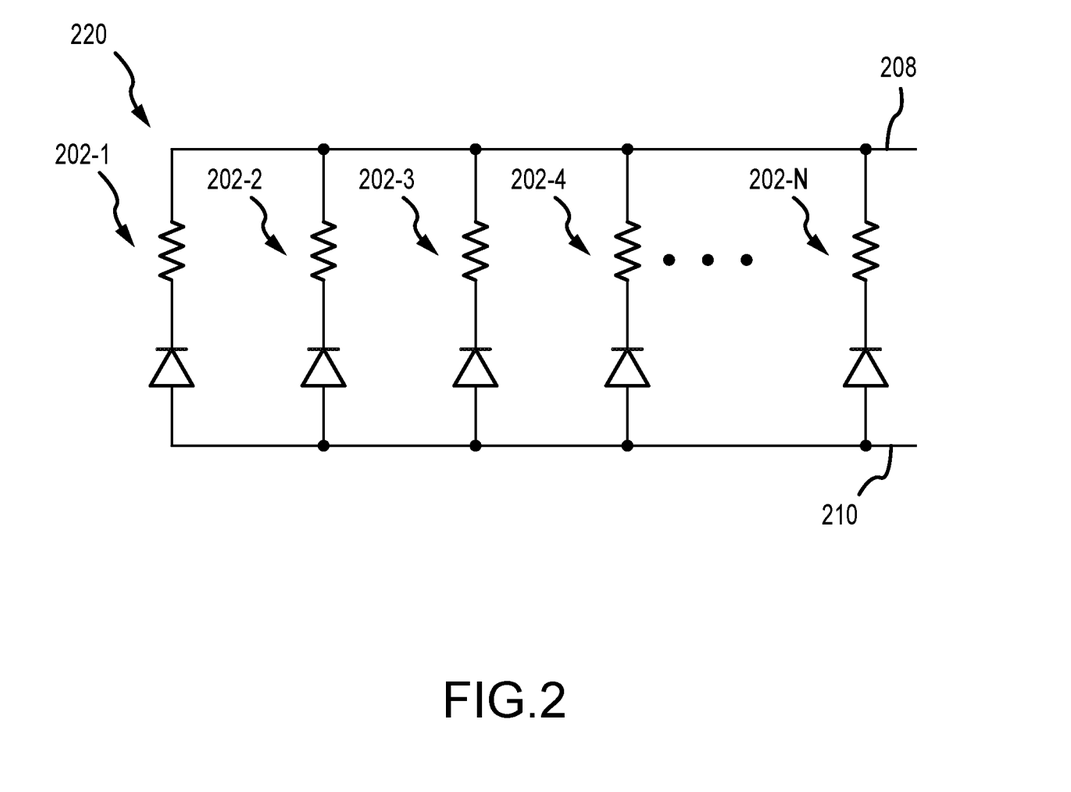
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
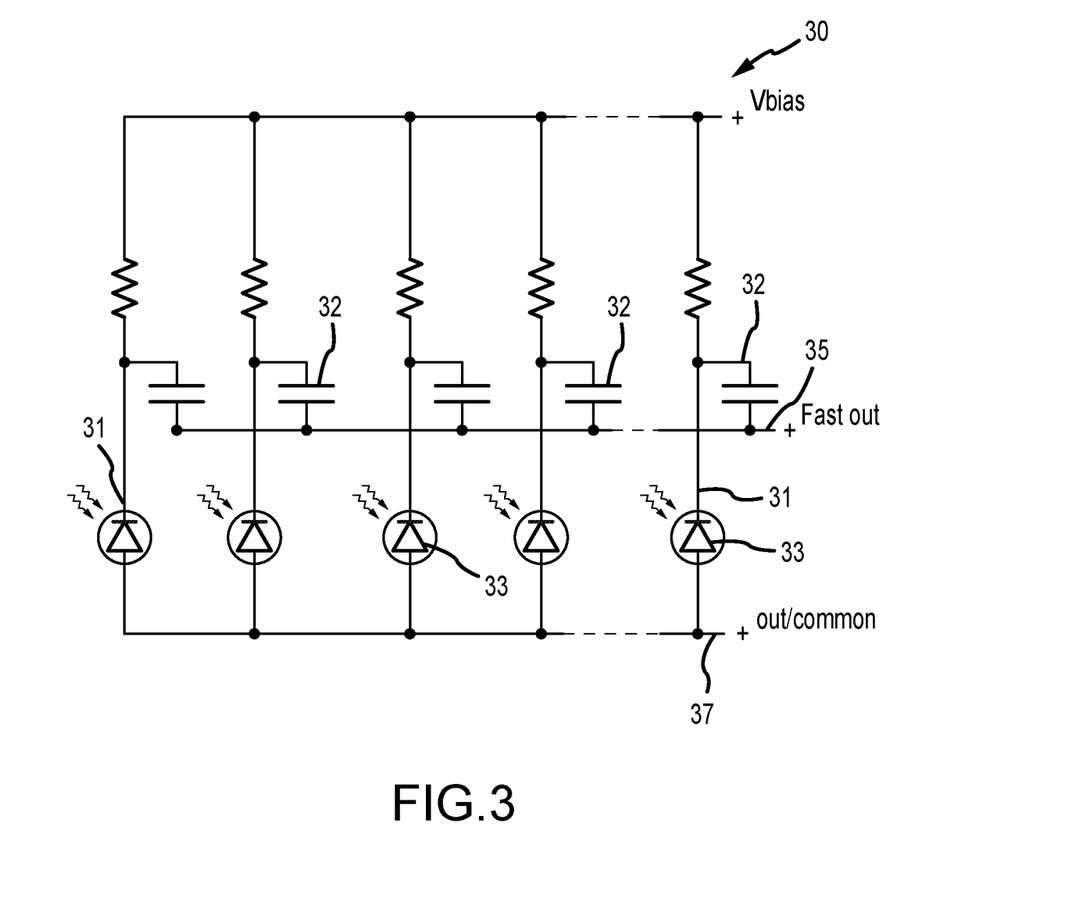
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
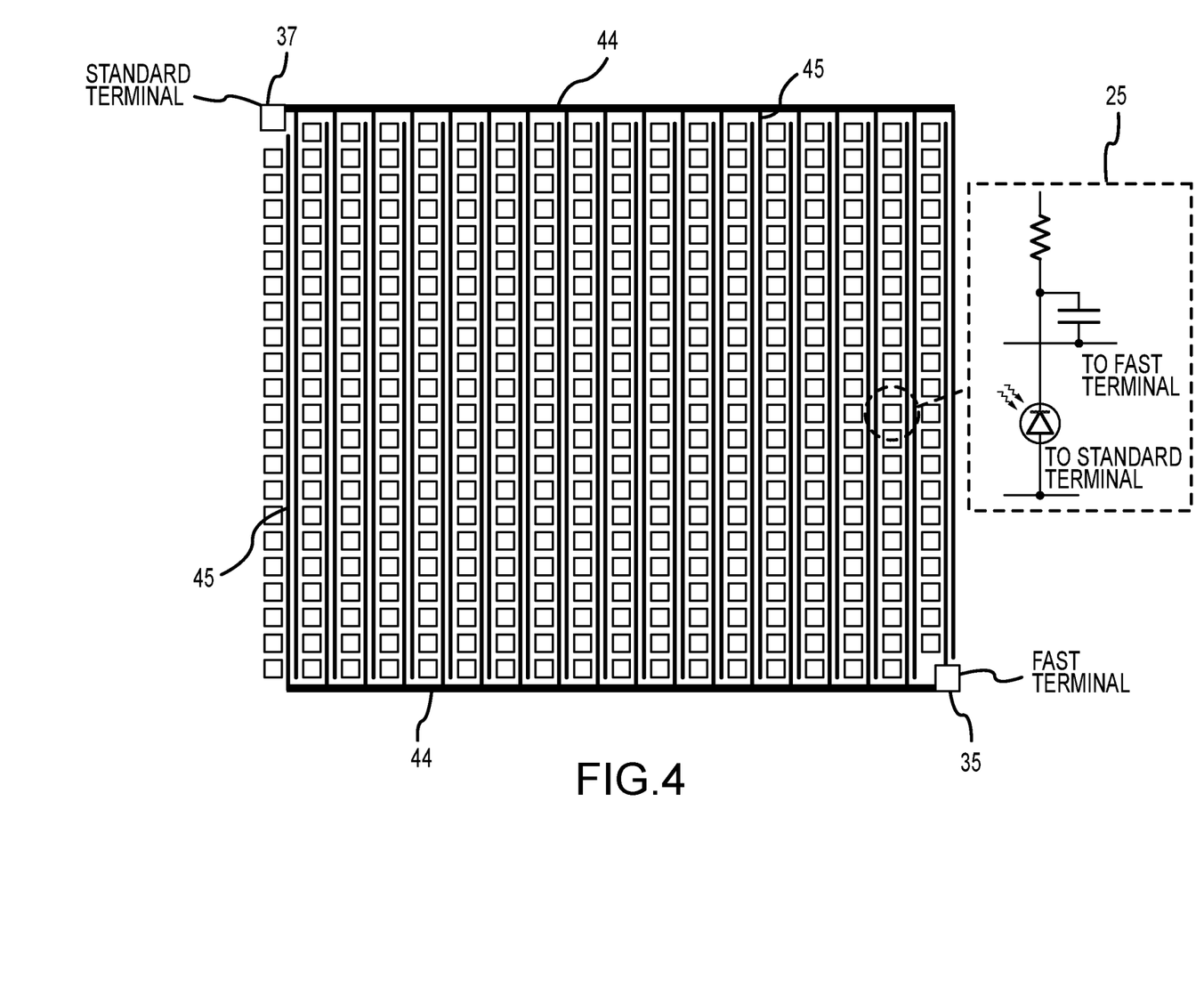
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
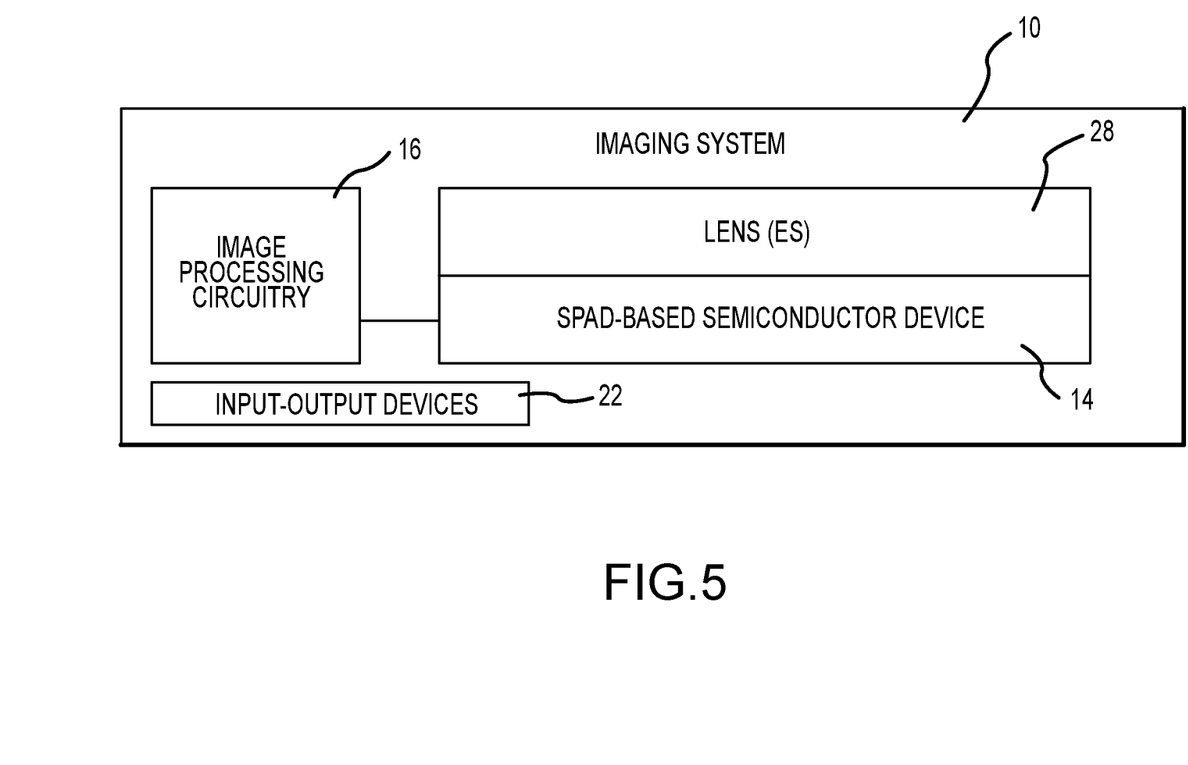
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a LIDAR (light detection and ranging) scheme.

In general, it may be desirable for a silicon photomultiplier (SiPM) to have SPADs closely spaced together. Tight spacing of the SPADs may increase the light-sensitive area of the silicon photomultiplier, with corresponding improvements to sensitivity. However, as the SPADs get closer together, the SPADS may become susceptible to crosstalk.

Crosstalk occurs when a photon incident on a first microcell causes an avalanche current on both the first microcell and a neighboring microcell. The avalanche current of the first microcell can in turn create photons that, during optical crosstalk, travel to a second, neighboring microcell and cause an avalanche current in the second microcell. This type of optical crosstalk is typically undesirable due to reduced dynamic range and reduced signal accuracy.

One way to reduce crosstalk is to reduce the over-bias amount of the single-photon avalanche diode. The over-bias voltage may refer to the amount that the bias voltage exceeds the breakdown voltage of the SPAD. Breakdown voltage is the largest reverse voltage that can be applied to a SPAD without causing an exponential increase in the leakage current in the diode. The more the bias voltage exceeds the breakdown voltage (e.g., the larger the over-bias voltage or over-bias amount), the more sensitive the SPAD becomes.

Figure 6:
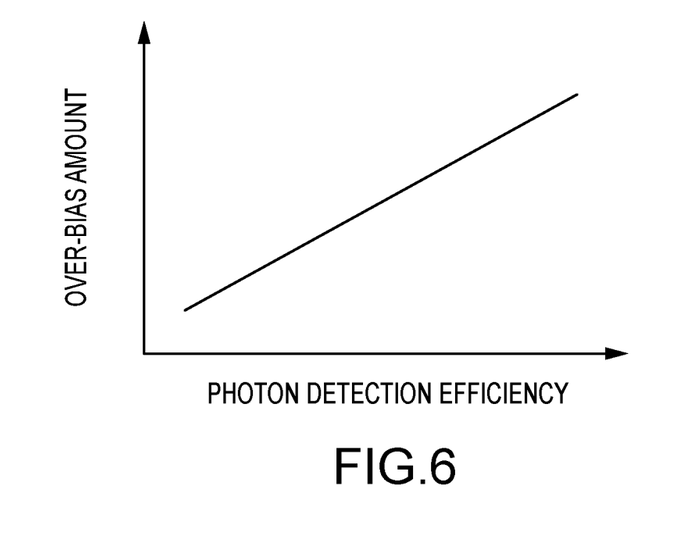
FIG. 6 is a graph showing the relationship of over-bias voltage versus photon detection efficiency in accordance with an embodiment.

FIG. 6 is a graph illustrating how photon detection efficiency increases with increasing over-bias. The total probability of a photon triggering an avalanche current may be referred to as the SPAD's photon-detection efficiency (PDE). In general, it is desirable for the SPAD to have a higher PDE, as this improves the sensitivity and performance of the SiPM. Increasing the over-bias amount may result in an increase in PDE. The linear profile of FIG. 6 is merely illustrative and meant to show the general relationship between over-bias and PDE.

Figure 7:
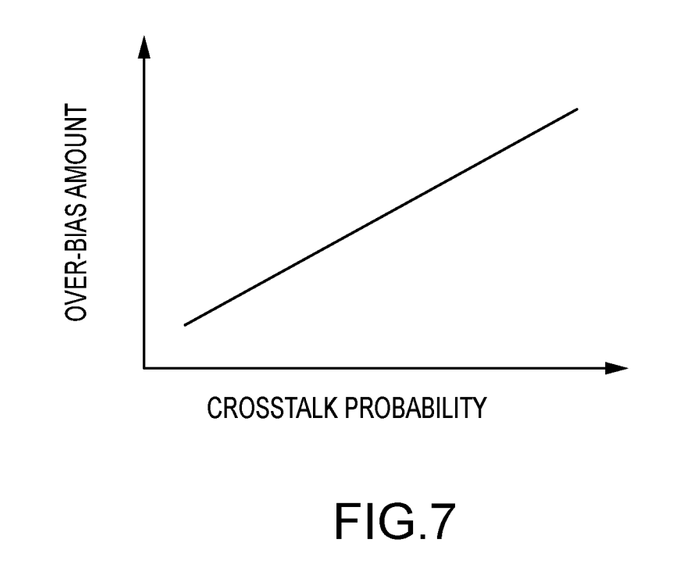
FIG. 7 is a graph showing the relationship of over-bias voltage versus crosstalk probability in accordance with an embodiment.

While increasing over-bias has the benefit of increasing photon detection efficiency, increased over-bias may also undesirably increase crosstalk. FIG. 7 is a graph illustrating how crosstalk probability increases with increasing over-bias. Increasing the over-bias amount may result in an increased crosstalk probability (e.g., the probability that an avalanche on a first microcell causes an avalanche on an adjacent microcell). The linear profile of FIG. 7 is merely illustrative and meant to show the general relationship between over-bias and crosstalk probability. Therefore, as shown by graphs of FIG. 6 and FIG. 7, increasing over-bias may advantageously increase PDE but undesirably increase crosstalk. To reduce the crosstalk probability of a SPAD-based semiconductor device, there may be a capacitive coupling between neighboring microcells. An avalanche current on a first microcell may cause a reduction in bias voltage on a neighboring microcell due to the capacitive coupling. The chance of crosstalk occurring may therefore be reduced in the neighboring microcell.

Figure 8:
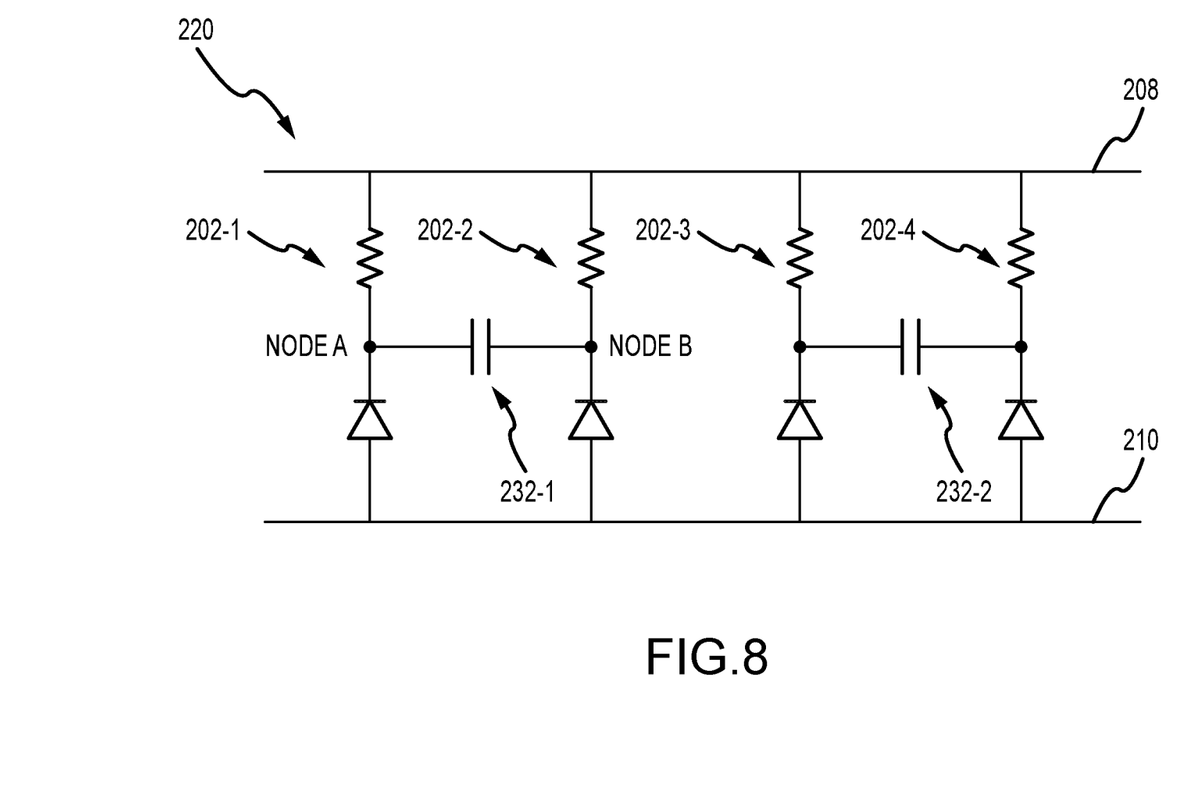
FIG. 8 is a diagram showing an illustrative silicon photomultiplier with single-photon avalanche diodes that are coupled together with a capacitor to reduce crosstalk in accordance with an embodiment.

FIG. 8 is a schematic diagram of an illustrative silicon photomultiplier with a capacitor between adjacent microcells in the silicon photomultiplier. FIG. 8 shows four illustrative SPAD devices 202-1, 202-2, 202-3, and 202-4 (sometimes referred to as microcells 202-1, 202-2, 202-3, and 202-4). The SPAD devices have a similar structure to as shown in FIGS. 1 and 2, with each SPAD device having a single-photon avalanche diode and quenching resistor coupled between a first supply voltage terminal 210 (e.g., a ground power supply voltage terminal) and a second supply voltage terminal 208 (e.g., a positive power supply voltage terminal).

To reduce crosstalk, a capacitor may be coupled between adjacent SPADs within the silicon photomultiplier. As shown in FIG. 8, capacitor 232-1 is coupled between node A of SPAD 202-1 (e.g., the cathode of SPAD 202-1) and node B of SPAD 202-2 (e.g., the cathode of SPAD 202-2). Capacitor 232-2 is coupled between the cathode of SPAD 202-3 and the cathode of SPAD 202-4.

The capacitive coupling between SPADs 202-1 and 202-2 may help reduce crosstalk between SPADs 202-1 and 202-2. Consider the example of a photon causing an avalanche current in SPAD 202-1. Node A will have a corresponding drop below the breakdown voltage due to the quenching of the avalanche current. Due to the presence of capacitor 232-1, node B may have a correlated, proportional drop in voltage at node B. This reduces the over-bias voltage of SPAD 202-2, temporarily suppressing the PDE of SPAD 202-2. This reduces the chance of crosstalk causing an avalanche in SPAD 202-2.

Herein, a microcell with an avalanche caused by an incident photon may sometimes be referred to as a triggering microcell, aggressing microcell, etc. A microcell next to the triggering microcell that is susceptible to crosstalk from the triggering microcell may be referred to as a victim microcell, neighboring microcell, etc. Each capacitor between SPADs in the silicon photomultiplier may have any desired capacitance. In general, a larger capacitance may increase the magnitude of voltage reduction at a victim microcell caused by an avalanche at the triggering microcell. The capacitance of each capacitor may be greater than 2 femtofarads (fF), greater than 4 femtofarads, greater than 6 femtofarads, greater than 8 femtofarads, greater than 10 femtofarads, greater than 12 femtofarads, less than 2 femtofarads, less than 4 femtofarads, less than 6 femtofarads, less than 8 femtofarads, less than 10 femtofarads, less than 12 femtofarads, between 2 and 12 femtofarads, between 6 and 15 femtofarads, between 4 and 10 femtofarads etc.

Figure 9:
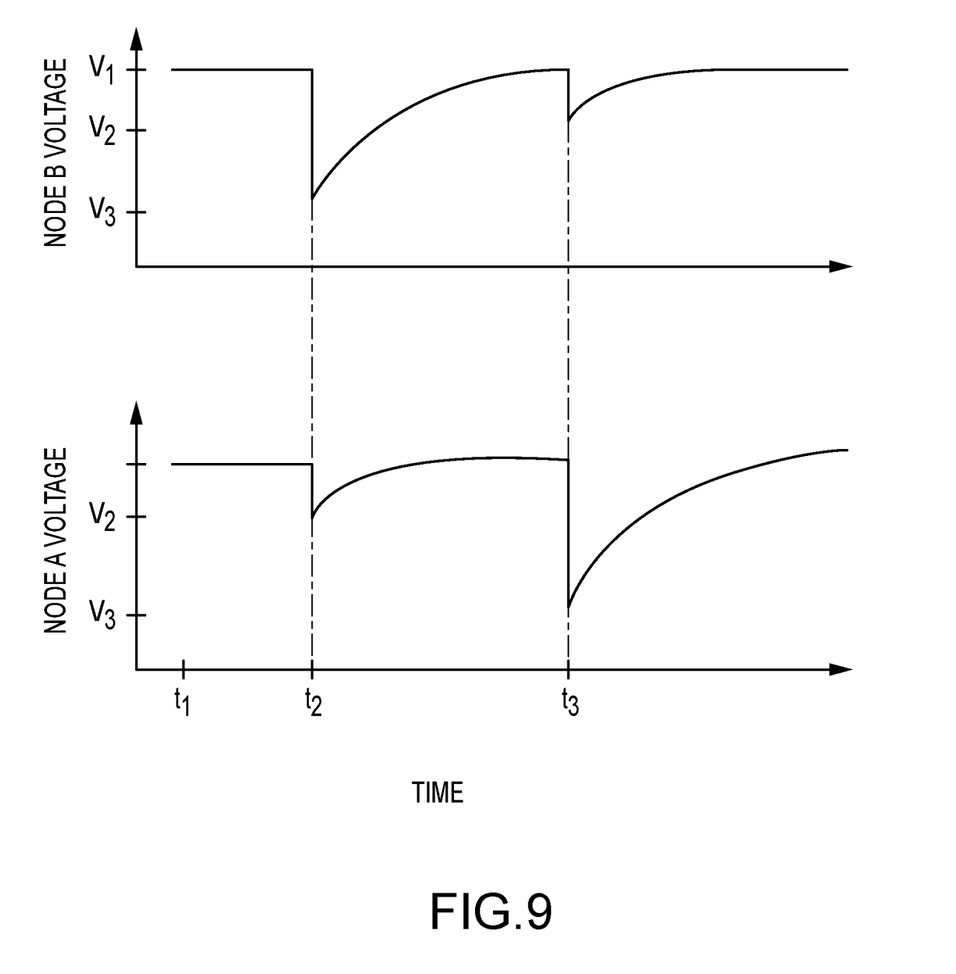
FIG. 9 is a timing diagram of the bias voltages of two microcells in FIG. 8 showing how crosstalk may be reduced using the arrangement of FIG. 8 in accordance with an embodiment.

FIG. 9 is a timing diagram showing illustrative voltages at node A and node B in FIG. 8 to show how crosstalk is suppressed by capacitor 232-1. As shown, at time $t_1$, the voltage at both nodes A and B may be $V_1$. $V_1$ may be an over-bias voltage of 5 V or some other desired over-bias voltage. Because both voltages are over-biased, the SPADs may have a relatively high photon detection efficiency.

At $t_2$, microcell 202-2 may have an avalanche caused by an incident photon on microcell 202-2. When the avalanche occurs, the quenching circuitry of microcell 202-2 may be used to lower the bias voltage of microcell 202-2 below the level of the breakdown voltage. Lowering the bias voltage of microcell 202-2 below the breakdown voltage stops the avalanche process and corresponding avalanche current. The timing diagram shows how the node B voltage drops sharply in response to the avalanche current caused by the incident photon and subsequent quenching. The node B voltage may fall to voltage $V_3$ that is below the breakdown voltage, for example.

Meanwhile, the voltage drop at node B may cause a corresponding voltage drop at node A due to the capacitive coupling between nodes A and B. As shown in FIG. 9, the node A voltage may also drop at $t_2$. The node A voltage does not drop as much as the node B voltage. For example, the node A voltage drops to voltage $V_2$ that is still above the breakdown voltage. However, the over-bias is still reduced from $V_1$ to $V_2$. This drop in the node A voltage will lower the photon detection efficiency of microcell 202-1. Microcell 202-1 is less likely to have an avalanche triggered when the over-bias is reduced in this manner. Therefore, an avalanche caused by crosstalk will be less likely to occur (due to a temporary drop in sensitivity that corresponds to the avalanche in the neighboring microcell).

After the avalanche is quenched, the voltages at both nodes A and B may increase back to the original over-bias levels. At $t_3$, an opposite scenario is shown, with microcell 202-1 having an avalanche triggered by an incident photon. This causes a drop in the voltage at node A to voltage $V_3$ that is below the breakdown voltage. Node B has a corresponding voltage drop to $V_2$, causing a decreased sensitivity during the time period when microcell 202-2 is susceptible to crosstalk from the microcell 202-1 avalanche. After quenching, the voltages again recover to the original over-bias levels at $V_1$.

Figure 10:
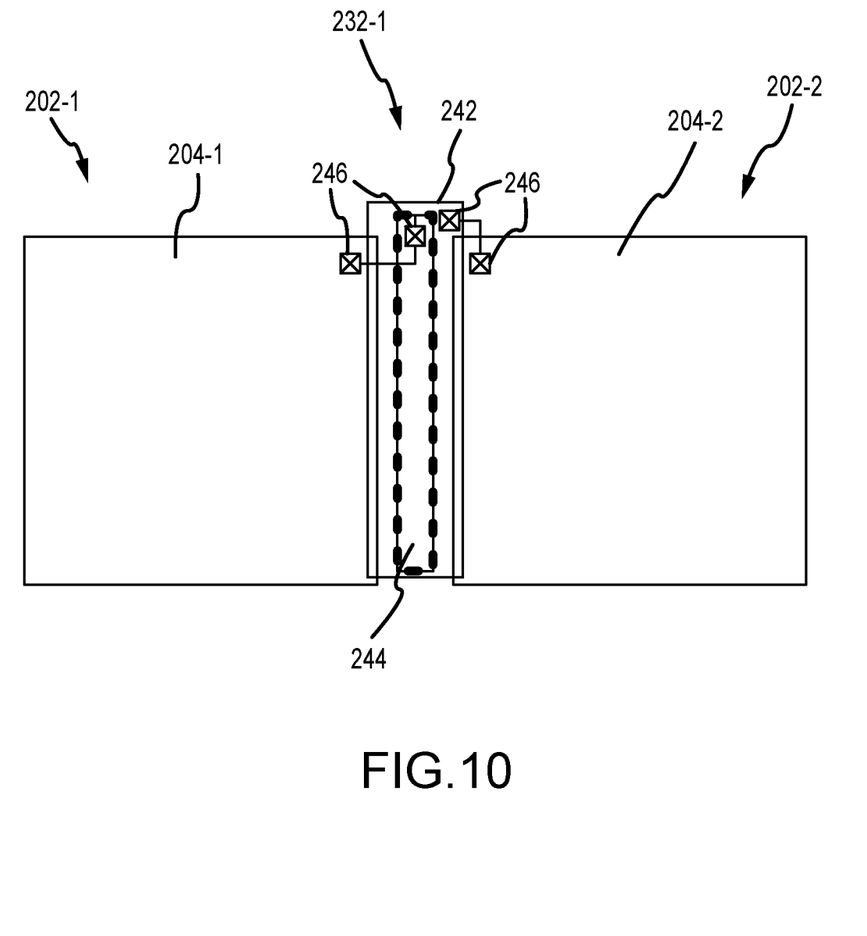
FIG. 10 is a top view of an illustrative silicon photomultiplier showing how a parallel plate capacitance may be formed between adjacent single-photon avalanche diodes in accordance with an embodiment.

FIG. 10 shows one illustrative example of forming a capacitor between microcells 202-1 and 202-2. As shown in FIG. 10, microcell 202-1 may have a corresponding single-photon avalanche diode 204-1 and microcell 202-2 may have a corresponding single-photon avalanche diode 204-2. SPAD 204-1 may be electrically connected to a conductive layer 244 using contacts 246. SPAD 204-2 may be electrically connected to a conductive layer 242 using contacts 246. Conductive layers 242 and 244 may be planar, overlapping conductive layers. One or more dielectric layers may be formed between the conductive layers. Accordingly, a parallel plate capacitance (capacitor 232-1) is formed between conductive layers 242 and 244. Conductive layers 242 and 244 may sometimes be referred to as capacitor plates 242 and 244. The conductive layers may have any desired size and may be plane parallel (e.g., conductive layer 242 is formed in a first plane and conductive layer 244 is formed in a second plane that is parallel to the first plane).

Conductive layer 242 may be coupled to the cathode of SPAD 204-2 and conductive layer 244 may be coupled to the cathode of SPAD 204-1. FIG. 10 shows an arrangement of this type, similar to as in FIG. 8. However, this example is merely illustrative. In another possible arrangement, conductive layers 242 and 244 may be electrically connected to the anode of the SPADs. One or more vias may be used to form the electrical connections between the SPADs and the conductive layers. Conductive layers 242 and 244 may have other, electrically separated portions on different sides of the SPADs 204-1 and 204-2 if desired. The other portions of conductive layers 242 and 244 may serve to transfer signals within the silicon photomultiplier, provide shielding for the silicon photomultiplier, etc.

The arrangement of FIG. 10 is merely illustrative. Any desired conductive layers or components may be used to form capacitor 232-1 between microcells 202-1 and 202-2. For example, in one alternate arrangement, conductive layers 242 and 244 may be coplanar and the capacitance (e.g., capacitor 232-1) may be formed by a fringing field between the two conductive layers. Conductive layers 242 and 244 may be formed from metal other desired materials. In some cases, resistive layers such as polysilicon may be used to form one or both of the plates in the capacitor. For example, layer 244 in FIG. 10 may be formed from polysilicon and layer 242 in FIG. 10 may be formed from metal (or vice versa).

FIGS. 8-10 have shown and discussed an example where each microcell is capacitively coupled to one adjacent microcell. This example is merely illustrative. It should be understood that a microcell may be capacitively coupled to more than one adjacent microcell, as shown in FIGS. 11 and 12.

Figure 11:
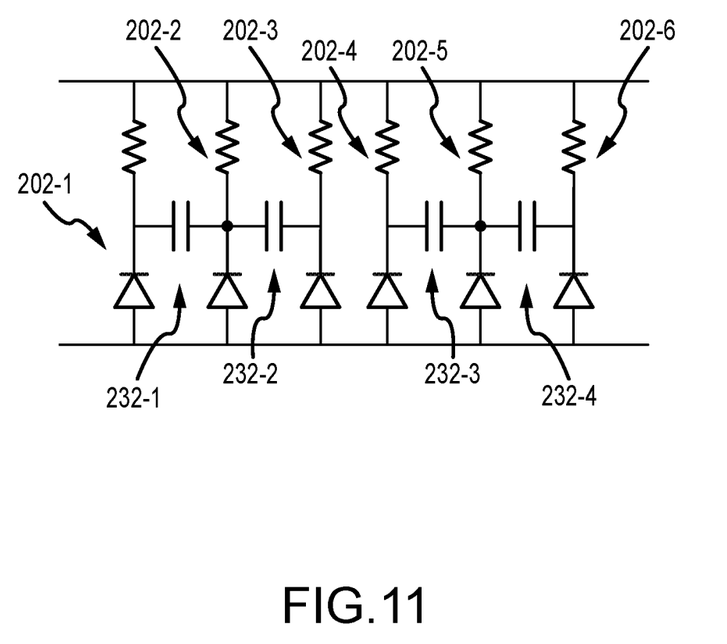
FIG. 11 is a diagram showing an illustrative silicon photomultiplier with a microcell coupled to two adjacent microcells to reduce crosstalk in accordance with an embodiment.

In FIG. 11, each microcell is coupled to two adjacent microcells. As shown, capacitor 232-1 is formed between microcells 202-1 and 202-2. Similarly, capacitor 232-2 is formed between microcells 202-2 and 202-3. With this arrangement, microcell 202-2 may have crosstalk mitigated when a photon triggers an avalanche in either microcell 202-1 or microcell 202-3. The crosstalk mitigation is therefore improved in the silicon photomultiplier. This pattern may be repeated across silicon photomultiplier 220. For example, capacitor 232-3 is formed between microcells 202-4 and 202-5 and capacitor 232-4 is formed between microcells 202-5 and 202-6.

Figure 12:
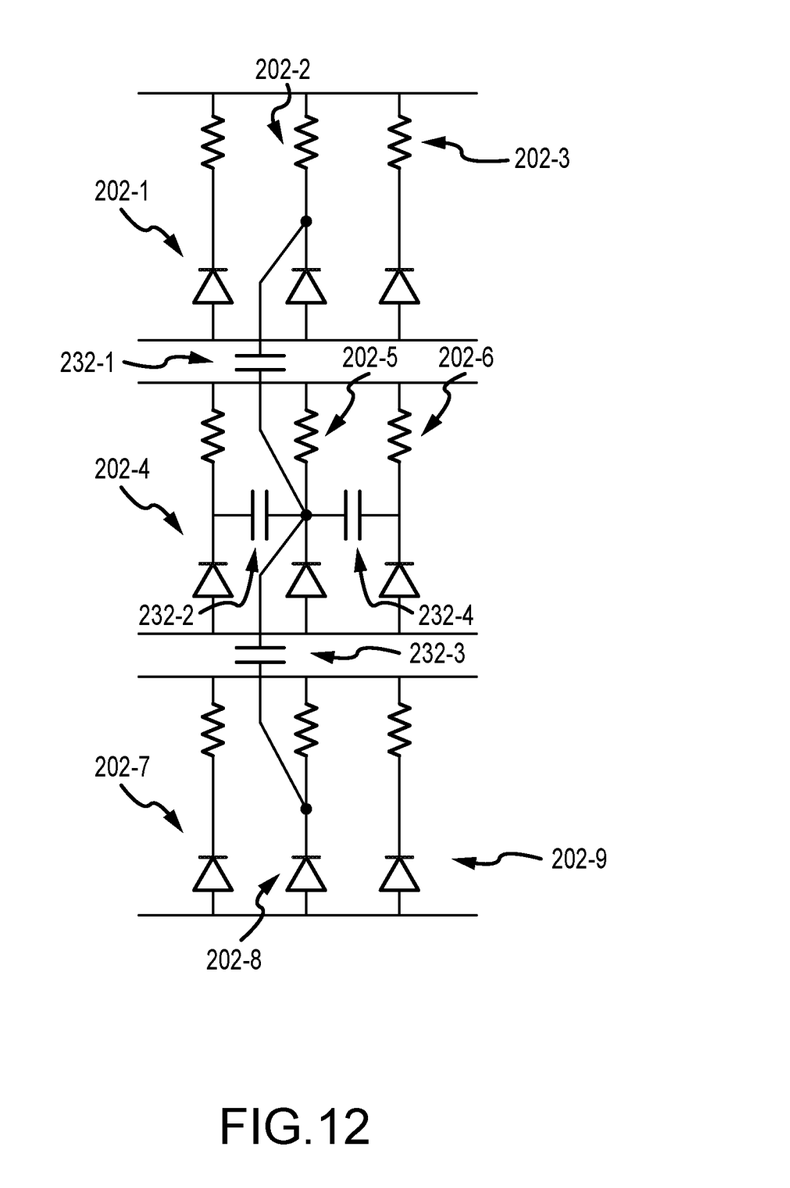
FIG. 12 is a diagram showing an illustrative silicon photomultiplier with a microcell coupled to four adjacent microcells to reduce crosstalk in accordance with an embodiment.

In yet another example, a silicon photomultiplier may have microcells capacitively coupled to four additional microcells, as shown in FIG. 12. Microcell 202-5 is coupled to microcell 202-2 by capacitor 232-1, is coupled to microcell 202-4 by capacitor 232-2, is coupled to microcell 202-8 by capacitor 232-3, and is coupled to microcell 202-6 by capacitor 232-4. This pattern may be repeated across the silicon photomultiplier if desired.

These arrangements are merely illustrative. In general, any desired number of microcells in any desired pattern may be capacitively coupled to reduce crosstalk. For example, a 2×2 group of microcells may be capacitively coupled to reduce crosstalk or a 3×3 group of microcells may be capacitively coupled to reduce cross-talk. A capacitor may be formed between microcells in the same row and adjacent columns (e.g., horizontally adjacent), between microcells in the same column and adjacent rows (e.g., vertically adjacent), or between microcells in adjacent rows and adjacent columns (e.g., diagonally adjacent). Each pair of coupled microcells may be coupled by multiple metallization layers. Multiple metallization layers may be used to couple multiple microcells together if desired.

Additionally, the example of a single capacitor being coupled between microcells to mitigate crosstalk is merely illustrative. The capacitor causes a smaller but proportional voltage drop on an adjacent microcell when a voltage drop occurs on a triggered microcell. Additional components or combinations of components may be used in place of the capacitor to achieve this effect. For example, a resistor or other component may be coupled between adjacent microcells instead of a capacitor.

The foregoing is merely illustrative of the principles of this invention and various modifications can be made by those skilled in the art. The foregoing embodiments may be implemented individually or in any combination.

What is claimed is:

1. A silicon photomultiplier, comprising:
   a first microcell that includes a first single-photon avalanche diode and first quenching circuitry;
   a second microcell that includes a second single-photon avalanche diode and second quenching circuitry; and
   a capacitor coupled between the first microcell and the second microcell that causes a drop in voltage at the second single-photon avalanche diode in response to an avalanche occurring in the first single-photon avalanche diode to mitigate crosstalk between the first and second microcells, wherein the capacitor has a first plate that is coupled to a selected one of a cathode and an anode of the first single-photon avalanche diode, wherein the capacitor has a second plate that is coupled to a selected one of a cathode and an anode of the second single-photon avalanche diode, wherein the first plate comprises a layer of metal that is formed between the first and second microcells, and wherein the second plate comprises a layer of polysilicon that is formed between the first and second microcells.

2. The silicon photomultiplier defined in claim 1, wherein the first plate is coupled to the cathode of the first single-photon avalanche diode and wherein the second plate is coupled to the cathode of the second single-photon avalanche diode.

3. The silicon photomultiplier defined in claim 1, wherein the first plate is coupled to a first node that is interposed between the first single-photon avalanche diode and the first quenching circuitry and wherein the second plate is coupled to a second node that is interposed between the second single-photon avalanche diode and the second quenching circuitry.

4. The silicon photomultiplier defined in claim 1, wherein the capacitor is a first capacitor, the silicon photomultiplier further comprising:
   a third microcell that includes a third single-photon avalanche diode and third quenching circuitry; and
   a second capacitor that is coupled between the first single-photon avalanche diode and the third single-photon avalanche diode.

5. The silicon photomultiplier defined in claim 4, further comprising:
   a fourth microcell that includes a fourth single-photon avalanche diode and fourth quenching circuitry;
   a fifth microcell that includes a fifth single-photon avalanche diode and fifth quenching circuitry;
   a third capacitor that is coupled between the first single-photon avalanche diode and the fourth single-photon avalanche diode; and
   a fourth capacitor that is coupled between the first single-photon avalanche diode and the fifth single-photon avalanche diode.

6. The silicon photomultiplier defined in claim 1, wherein the capacitor has a capacitance that is between 2 and 12 femtofarads.

\* \* \* \* \*